United States Patent
Kinoshita

(10) Patent No.: US 7,955,876 B2
(45) Date of Patent: Jun. 7, 2011

(54) METHOD FOR SIMULATING DEPOSITION FILM SHAPE AND METHOD FOR MANUFACTURING ELECTRONIC DEVICE

(75) Inventor: Shigeru Kinoshita, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 595 days.

(21) Appl. No.: 11/859,152

(22) Filed: Sep. 21, 2007

(65) Prior Publication Data

US 2008/0220546 A1 Sep. 11, 2008

(30) Foreign Application Priority Data

Mar. 6, 2007 (JP) ................................. 2007-056281

(51) Int. Cl.
*H01L 21/66* (2006.01)
(52) U.S. Cl. ................ 438/16; 438/4; 438/14; 700/121; 702/170; 257/E21.53
(58) Field of Classification Search ................ 438/6, 14, 438/16; 700/121; 702/170
See application file for complete search history.

(56) References Cited

U.S. PATENT DOCUMENTS

| | | | | |
|---|---|---|---|---|
| 5,450,205 A | * | 9/1995 | Sawin et al. | 356/632 |
| 5,847,973 A | * | 12/1998 | Kumashiro | 703/13 |
| 6,913,938 B2 | * | 7/2005 | Shanmugasundram et al. | 438/16 |
| 7,195,934 B2 | * | 3/2007 | Aderhold et al. | 438/14 |
| 7,592,254 B2 | * | 9/2009 | Abelson et al. | 438/677 |
| 2002/0045282 A1 | * | 4/2002 | Opsal et al. | 438/16 |
| 2002/0106819 A1 | * | 8/2002 | Nozawa et al. | 438/14 |
| 2004/0044419 A1 | * | 3/2004 | Saki et al. | 700/2 |
| 2007/0100553 A1 | * | 5/2007 | Furuya | 702/1 |

FOREIGN PATENT DOCUMENTS

JP 09-246189 9/1997
* cited by examiner

*Primary Examiner* — Alexander G Ghyka
(74) *Attorney, Agent, or Firm* — Pearne & Gordon LLP

(57) ABSTRACT

A deposition film shape simulation method for calculating a thickness of a thin-film formed by supplying deposition species on a substrate surface, includes: changing a parameter to be used in the calculation depending on the thickness of the deposited thin-film.

18 Claims, 6 Drawing Sheets t1=t1'   t3=t3'
s1>s1'   s3=s3'

METHOD FOR SIMULATING DEPOSITION FILM SHAPE AND METHOD FOR MANUFACTURING ELECTRONIC DEVICE

CROSS-REFERENCE TO RELATED APPLICATIONS

This application is based upon and claims the benefit of priority from the prior Japanese Patent Application No. 2007-056281, filed on Mar. 6, 2007; the entire contents of which are incorporated herein by reference.

BACKGROUND OF THE INVENTION

1. Field of the Invention

The present invention relates to a method for simulating deposition film shape and a method for manufacturing electronic device, and particularly, to a method for simulating deposition film shape with high accuracy and a method for manufacturing electronic device using the simulation method.

2. Background Art

Thin-film forming process such as LPCVD (Low Pressure Chemical Vapor Deposition) method is often used in electronic device manufacturing. For example, such thin-film forming technique is often used for the filling of deep trenches and contact holes. However, with the advance of finer design rules, it has been getting more difficult to form a film with good side coverage (side film thickness/top film thickness). In film forming for filling fine holes, changes in a sticking coefficient and growth rate depending on film forming conditions and film forming stages are significant factor in hampering better film formation. Especially, a decrease of the thickness of formed films due to the finer design rules in conjunction with the film forming mechanism makes it further difficult to form a film with good side coverage.

Optimization has been performed by conducting film formation several times varying a film-forming parameter. However since the experiments take a lot of time and efforts, deposition film shape simulations have been conducted for the deposition process in the past. However, in conventional CVD models the whole deposition process are expressed with single model parameter regardless of whether it is at early stage or middle stage of the deposition process. Since they do not take account of changes in a sticking coefficient and growth rate, they cannot simulate side coverage properly. As an example, Japanese patent laid-open publication JP-A 9-246189(Kokai) discloses a simulation for film forming on trenches.

SUMMARY OF THE INVENTION

According to an aspect of the invention, there is provided a deposition film shape simulation method for calculating a thickness of a thin-film formed by supplying deposition species on a substrate surface, including: changing a parameter to be used in the calculation depending on the thickness of the deposited thin-film.

According to another aspect of the invention, there is provided a deposition film shape simulation method for calculating a thickness of a thin-film formed by supplying deposition species on a substrate surface, including: establishing a film-forming model corresponding the substrate surface and deposition species; setting a simulation time zero; determining a parameter for each point of the substrate surface; calculating a growth rate at each point of the substrate surface using the parameters; progressing the simulation time and finding a thickness at a target point of the substrate surface; measuring thickness at each point of the substrate surface if the thickness at the target point is smaller than a target thickness; re-determining the parameter for each point of the substrate surface by using the thickness at each point; and repeating the calculating, the progressing, the measuring, and the re-determining until the thickness at the target point reaches to the target thickness.

According to another aspect of the invention, there is provided an electronic device manufacturing method including: determining a deposition condition of a thin-film by a deposition film shape simulation method for calculating a thickness of the thin-film formed by supplying deposition species on a substrate surface, including changing a parameter to be used in the calculation depending on the thickness of the deposited thin-film; and depositing the thin-film under the deposition condition.

DETAILED DESCRIPTION OF THE INVENTION

Embodiments of the invention will be explained in detail hereinafter, with reference to the drawings.

Figure 1:
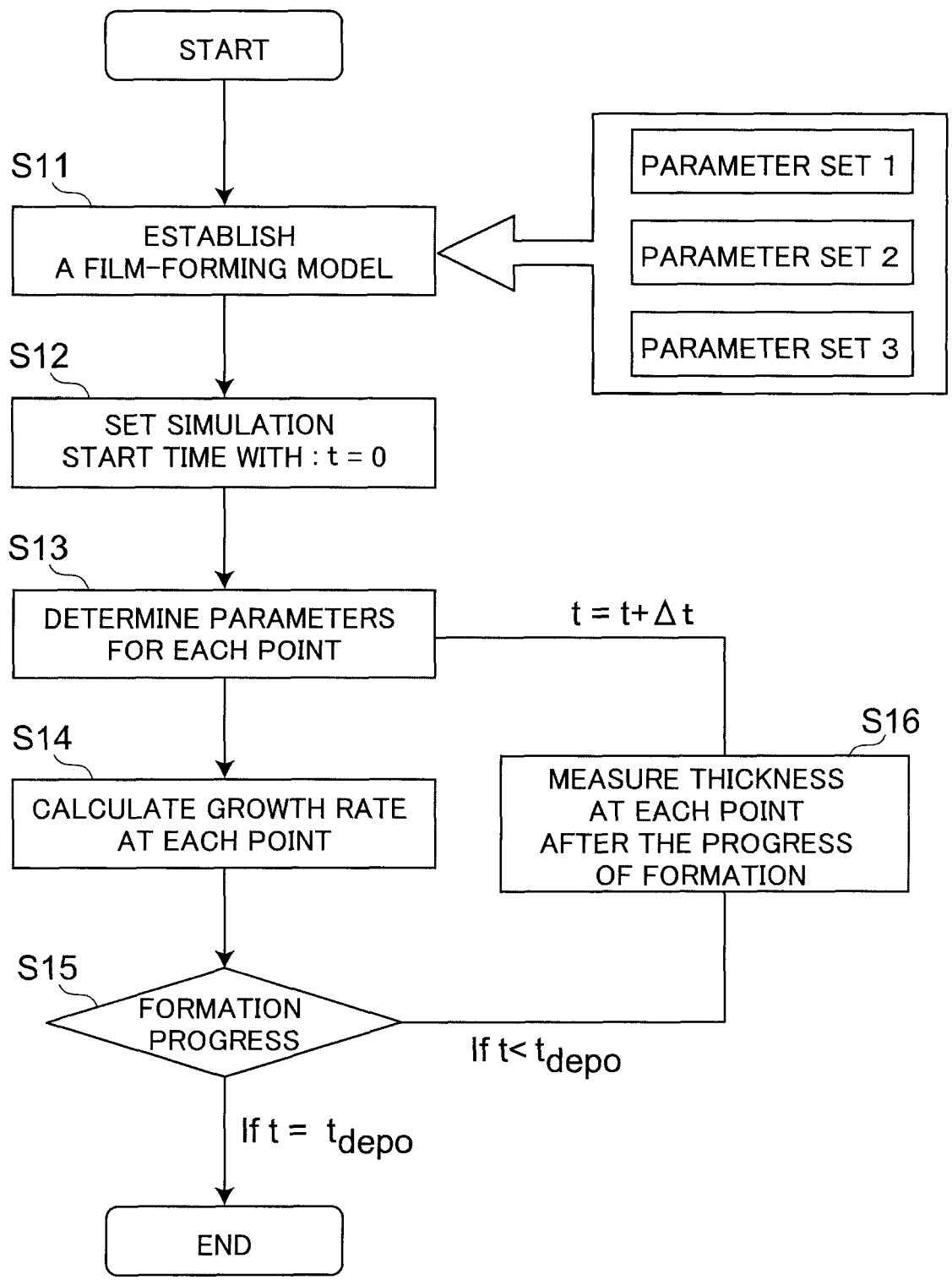
FIG. 1 shows a flow chart for a method for simulating deposition film shape in accordance with an embodiment of the invention.

FIG. 1 shows a flow chart for a method for simulating deposition film shape in accordance with an embodiment of the invention.

Firstly, a film-forming model is established (step S11), then the simulation start time is set with t=0 (step S12), and parameters for each point are determined (step S13). Then, the growth rate at each point is calculated (step S14), and a film is formed as the formation progresses (step S15). When the thickness of the film at the target point reaches the target thickness $t_{depo}$, the simulation is finished. However, if it doesn't reach the target thickness $t_{depo}$, the thickness at each point is measured (step 16), the parameters are re-determined at the step S13 and the steps from S13 to S15 are repeated.

At the step S11, the film-forming model is established, and the sticking coefficient and growth rate are determined depending on the film-forming mechanism of the film-forming system. For the parameters, in case of using LPCVD method or the like, the sticking coefficient and the growth rate are determined based on temperature, pressure, gas species, film thickness, surface atom species, gas flow rate, or the like. In addition, nozzle shape, furnace shape, the distance between wafers, or the like may be also factors affecting the sticking coefficient and the growth rate.

When returning to the step S13, the film-forming process which varies depending on growth stages is simulated by determining the sticking coefficient and the growth rate depending on film thickness at each point. It enables to estimate the film shape such as film thickness distribution in accordance with the reality.

Figure 2:
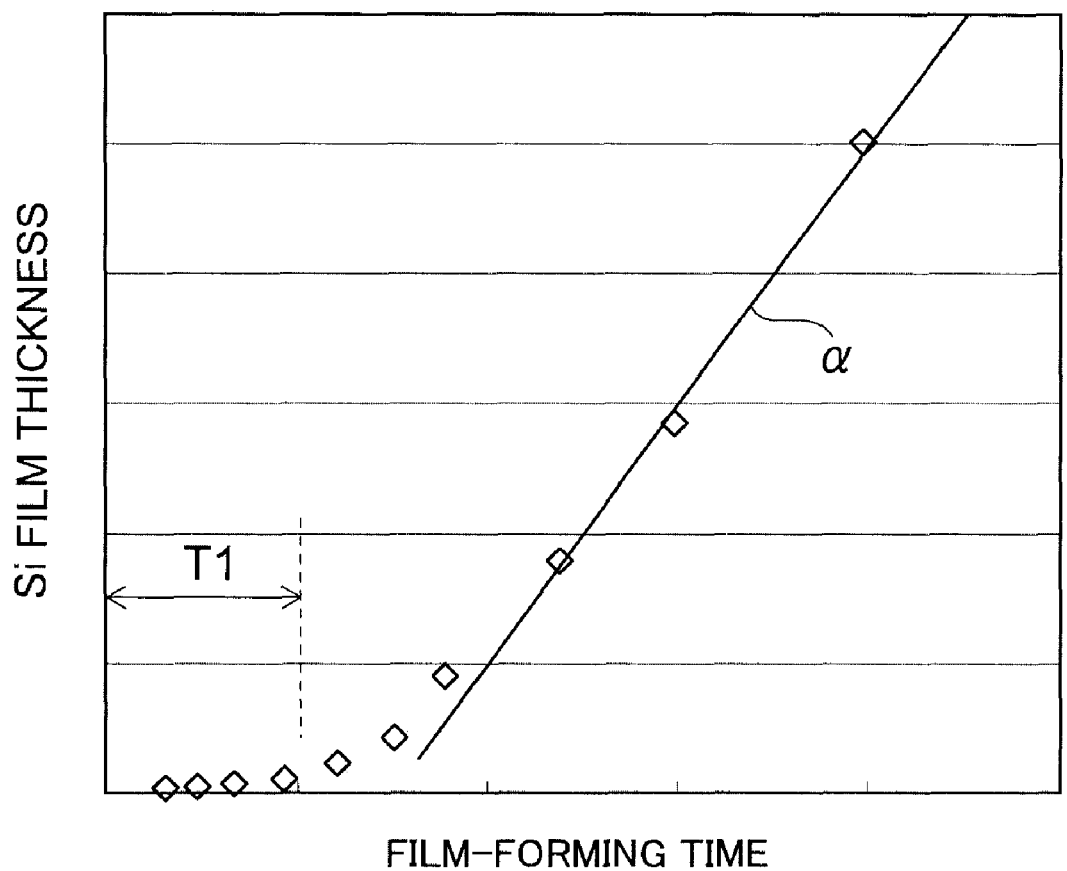
FIG. 2 is a graph showing time dependence of the thickness of deposited film.

FIG. 2 is a graph showing time dependence of the thickness of deposited film of silicon in the case where silicon is deposited on silicon oxide surface with a CVD method. The horizontal axis represents growth time, and the vertical axis represents the thickness of deposited silicon in FIG. 2.

Figure 3A:
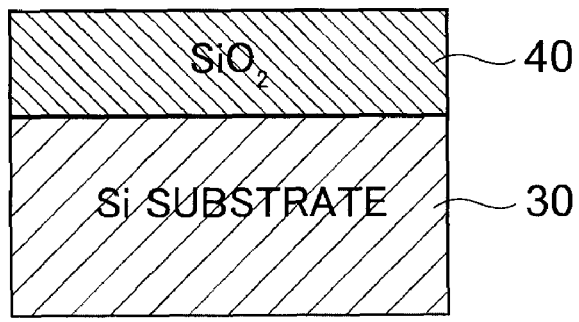
FIGS. 3A to 3C are a schematic view exemplifying the process for depositing silicon on silicon oxide surface.
Figure 3B:
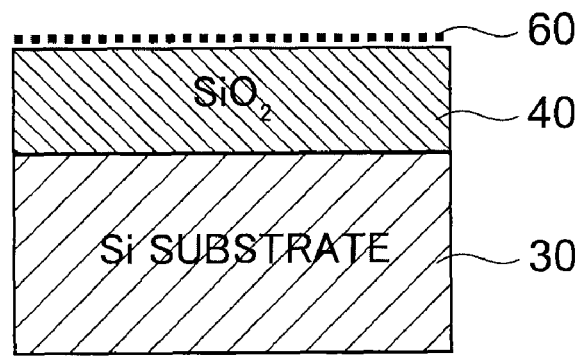
Figure 3C:
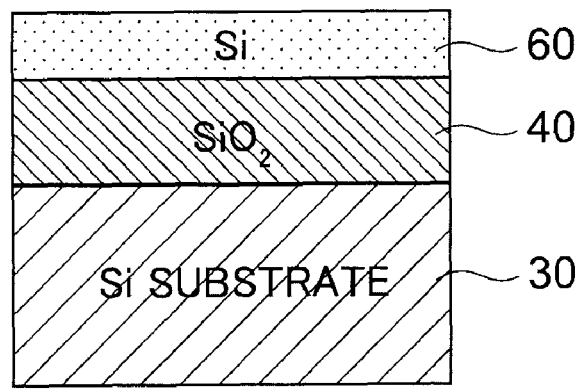

Further, FIGS. 3A to 3C are schematic views exemplifying the process for depositing silicon on silicon oxide surface. In particular, FIGS. 3A to 3C illustrate the process in which silicon oxide 40 is formed on the surface of a silicon substrate 30, and silicon 60 is deposited on the surface of the silicon oxide 40.

As shown in FIG. 2, at early stage, the thickness of deposited film is not linear to the deposition time, and there is a period T1 in which the deposition rate of silicon is almost zero. In the period T1, as shown in FIG. 3B, silicon deposition species are supplied to the silicon oxide surface, then they stick to the surface of the silicon oxide and migrate, and growth nuclei are formed in islands shape. However, on the silicon oxide surface, not only the adsorption and migration of the deposition species of silicon supplied from the vapor phase occur, but also desorption of the absorbed silicon into the vapor phase occurs. At very early stage of the growth, the size of the silicon growth nuclei formed on the silicon oxide is not sufficiently large, and a lot of growth nuclei vanish by desorption into the vapor phase. Therefore, the thickness of deposited film does not increase linearly to the progress of the growth time, and it is thought that the latency period exists in increase of the deposited film thickness.

As the density of the silicon growth nuclei formed on the silicon oxide surface increases, the deposition rate of the silicon increases. That is, on the growth surface, as the coverage rate of deposited silicon, which is the same kind of material as silicon in vapor phase, increases in amount, the silicon in vapor phase has a higher tendency to adsorb on the growth surface, thereby to contribute to the growth. As a result, the thickness of silicon deposition film starts to increase linearly. In the case of the example shown in FIG. 2, the thickness of silicon deposition film starts to increase and increase linearly substantially along the straight line a after the certain period T1.

As explained above, the growth rate is low at the early stage of the thin-film deposition, and then the growth rate comes close to a constant value as the deposition progresses. The reason for this is thought that the deposition is affected by the under surface. That is, it is thought that behavior such as adsorption of the deposition species, surface migration and bonding state at the growth front varies whether a thin-film is deposited on the same kind of material or on a different kind of material. At the early stage of the growth, the growth rate is not stable due to a strong influence from the different kind of material of the under surface. And then, it is thought that after a thin-film is deposited with some extent, the growth rate is stabilized as the influence form the under surface is blocked.

In the case where silicon is deposited on silicon oxide surface, if the intended thickness of thin-film to be deposited is equal to or less than 10 nm, the influence from the under surface is large. Therefore, it is necessary to adjust the parameters used in the deposition film shape simulation method. That is, it is possible to reproduce the time dependence of the film thickness as shown in FIG. 2 by determining a plurality of parameter sets depending on the thin-film thickness. For example, by suitably determining the growth rate and the sticking coefficient depending on the film thickness, it is possible to obtain a result that closely approximates to the actual film thickness as shown in FIG. 2.

In addition, it should be noted that this tendency is not limited to cases in which silicon is deposited on silicon oxide, but is brought about in general cases in which a thin-film is deposited on a different kind of material. Furthermore, even if a thin-film is deposited on the same kind of material, this tendency may occur frequently. For example, in the case that silicon is deposited on silicon substrate, it might be quite rare that the substrate has the ideal clean surface, and in most cases, different kinds of elements, such as oxygen or the like, are being absorbed or bonded physically or chemically to the silicon substrate surface. If silicon is deposited on such substrate surface, the process might be similar to the case in which silicon is deposited on a substrate made of a different element.

Next, another example in which silicon is deposited on a substrate having trenches is explained hereinafter.

Figure 4:
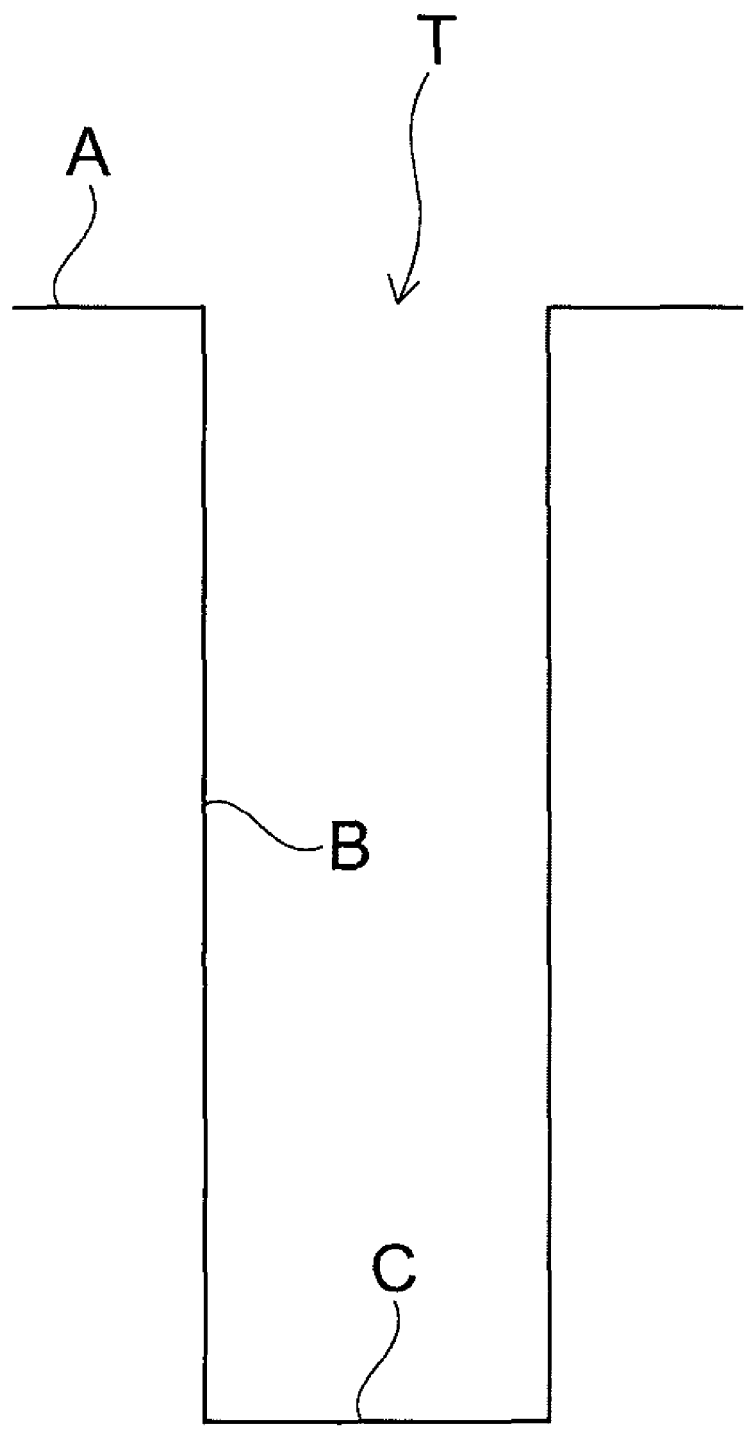
FIG. 4 is a schematic cross section view showing a substrate having trenches.

FIG. 4 is a schematic cross section view of a substrate having trenches.

Figure 5:
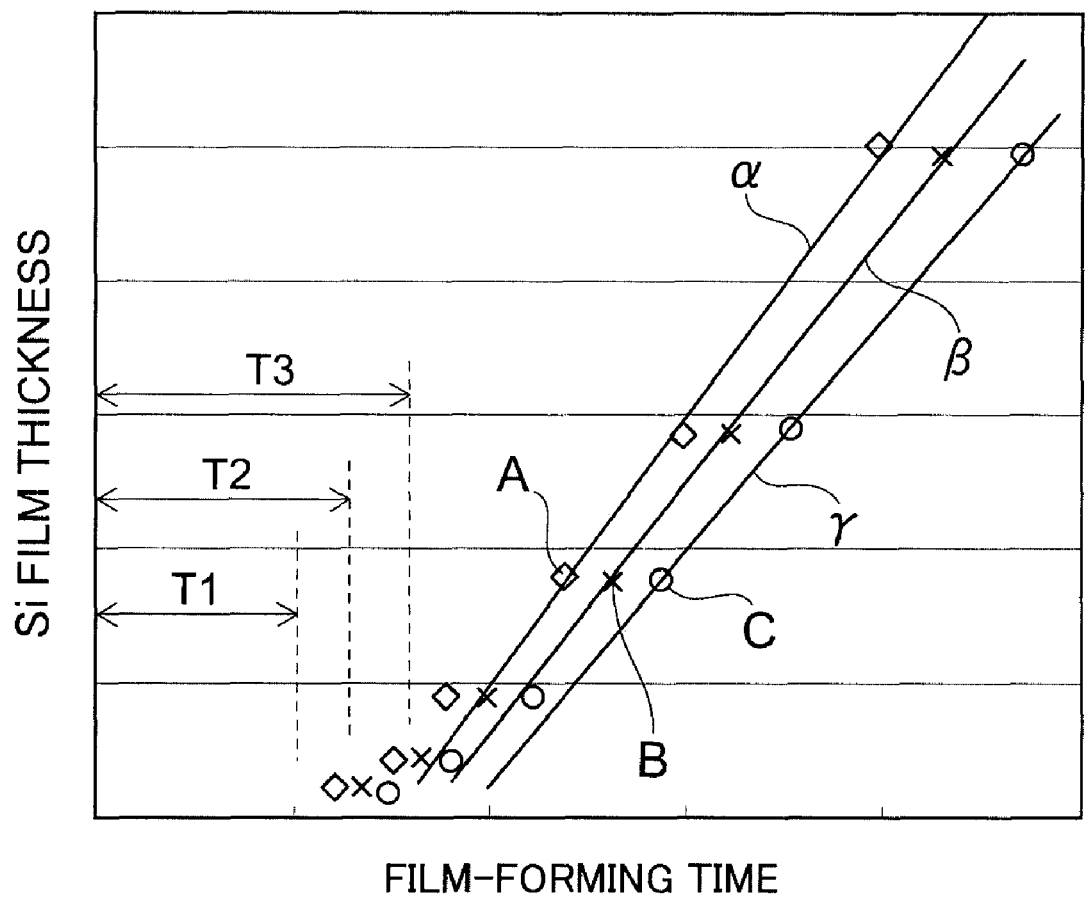
FIG. 5 is a graph showing the relation between deposition time and deposition film thickness when silicon is deposited on the substrate with the hole.

Further, FIG. 5 is a graph showing the relation between deposition time and deposition film thickness when silicon or the like is deposited on such substrate for example.

The deposition rates at the top surface A, at the sidewall B and at the bottom surface C are not the same on the substrate with a trench T. In addition, at all the locations, there are the periods in which the growth rate is substantially zero at the early stage of the growth, as explained above with reference to FIGS. 2 and 3. Then, after the periods, the deposition film thickness increases linearly.

Furthermore, the supply rates of deposition species are also different among the top surface A, sidewall B, and bottom surface C. In particular, the supply rate of deposition species in the sidewall B is lower than that in the top surface A, and the supply rate in the bottom surface C is lower than that in the sidewall B. The higher the sticking coefficient of the deposition species to the substrate is, the more prominent this tendency becomes.

Therefore, the period in which the growth rate is very low also differs as shown in FIG. 5. In particular, the period T2 of the sidewall B becomes longer than the period T1 of the top surface A, and the period T3 of the bottom surface C becomes further longer.

Furthermore, in the periods in which the deposition film thickness increases linearly, the angles of the straight lines, that is, the growth rates of the film thicknesses are different from each other. In particular, the angle of the line β of the sidewall B is smaller than the angle of the line α of the top surface A, and the angle of the line γ of the bottom surface C becomes further smaller. This is because the supply rates of the deposition species differ. Accordingly, in the deposition film simulation, it is desirable to appropriately adjust parameters depending on the growth film thickness and growth time, taking account of the supply rate distribution of deposition species at each part of a substrate.

Figure 6A:
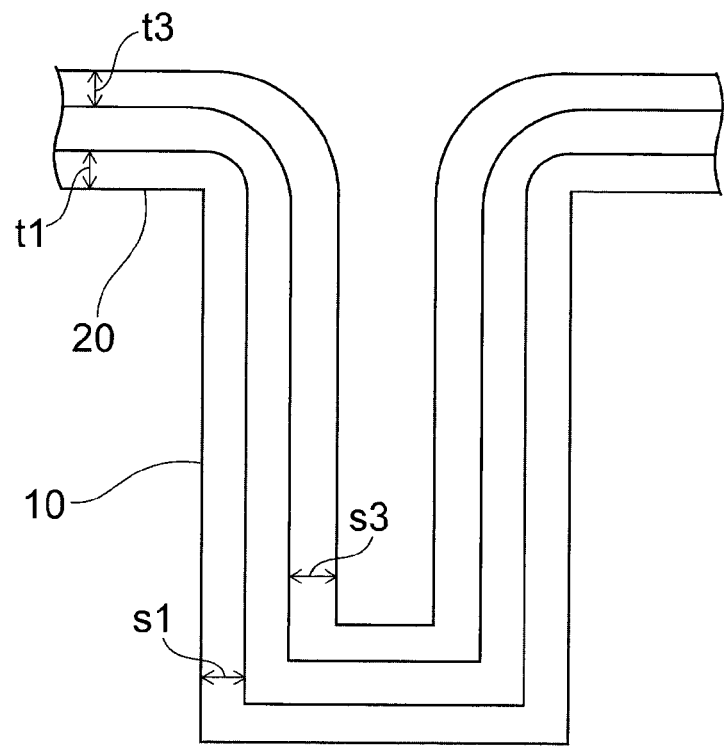
FIGS. 6A and 6B are conceptual diagrams showing a simulation result by a comparative example and actual result of film deposition for filling fine hole.
Figure 6B:
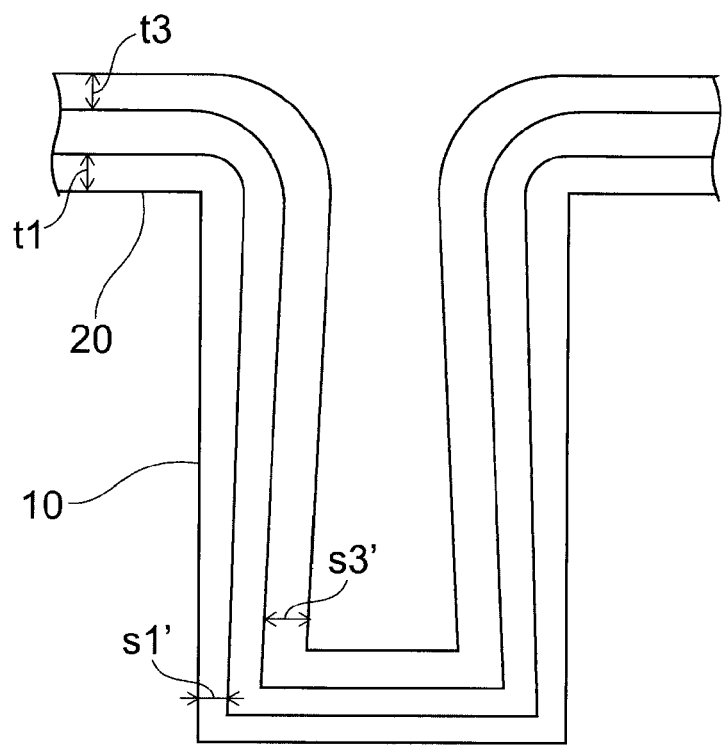

FIGS. 6A and 6B are conceptual diagrams showing the simulation result of the filling of fine holes with LPCVD method. FIG. 6B shows the actual deposition film shape, and FIG. 6A shows the deposition film shape for conventional simulation.

There is no significant difference between the deposition film shape by conventional simulation and the actual deposition shape at the top surface 20. In particular, the early stage film thicknesses t1 and t1' are nearly equal to each other, and the end stage film thicknesses t3 and t3' are also almost identical. However, in the inner portion of the hole sidewall 10, the actual film thickness s1' at the early stage is smaller than the film thickness s1 by conventional simulation. Although the film thicknesses s3 and s3' becomes nearly equal to each other at the end stage, the total film thickness on the hole sidewall 10 becomes smaller than that on the top surface 20. In this way, conventional simulation cannot express the film thickness distribution caused by the change in the growth rate during deposition process. Especially, the thinner the film thickness becomes due to the finer design rules, the higher the percentage occupied by the early stage deposition to the whole film thickness becomes. Therefore, it is extremely effective to estimate the thicknesses and shapes of actual products beforehand in order to effectively implement the manufacturing of electronic devices in the manufacturing of electric devices. For electronic devices in recent years, the width of an actual hole is, for example, 50 nm, thereby the intended thickness is not necessarily large enough. Therefore, if the film thickness is equal to or less than 10 nm, the growth rate change over time cannot be negligible.

Meanwhile, the deposition film simulation method in accordance with the embodiment can accurately reproduce the actual film thickness distribution such as the one shown in FIG. 6B.

A vapor-surface reaction model associated with Si growth, and parameters used in the simulation are explained hereinafter.

Firstly, following three types of reactions may occur in non-doped Si film forming process.

$$SiH_4(g) \rightarrow Si(s) + 2H_2(g) \tag{1}$$

$$SiH_2(g) \rightarrow Si(s) + H_2(g) \tag{2}$$

$$Si_2H_6(g) \rightarrow 2Si(s) + 3H_2(g) \tag{3}$$

The sticking coefficients of Si at 530° C. corresponding to reactions (1), (2) and (3) are $2.21 \times 10^{-5}$, $1 \times 10^{-4}$, and $1.82 \times 10^{-4}$, respectively.

The result of the deposition film shape simulation of film-forming for filling fine holes having the surface covered with silicon oxide, using these sticking coefficients of $SiH_4$ is explained hereinafter.

In the comparison between the hole sidewall 10 and the top surface 20 shown in FIG. 6B, the film thickness of the hole sidewall 10 is smaller than that of the top surface 20 at early stage. The reason for this is believed to be that since $SiH_2$ does not reach to the hole sidewall 10, the contribution rate of $SiH_2$ is low. In addition, due to the effect of the silicon oxide substrate, the sticking coefficient of $SiH_4$ remains low compared to that of the top surface 20.

On the other hand, as the deposition process progresses, the influence of the silicon oxide under the deposition film becomes negligible on everywhere in the hole sidewall 10 so that the growth proceeds with the same sticking coefficient as the case in which silicon is deposited on silicon surface, thereby the difference in film thicknesses between the top surface 20 and hole sidewall 10 becomes very small.

In comparison with the measured results of film thickness of the actual silicon deposition, the simulated results are described as follows. According to the experimental results, the thicknesses of the deposited silicon film were 322 angstroms at the vicinity of the lower end of the hole sidewall 10, 352 angstroms at the vicinity of the upper end of the hole sidewall 10, and 380 angstroms on the top surface 20. On the other hand, according to the simulation in accordance with the embodiment, the film thicknesses were 328 angstroms at the vicinity of the lower end of the hole sidewall 10, 351 angstroms at the vicinity of the upper end of the hole sidewall 10, and 380 angstroms on the top surface 20. That is, the difference between the experimental result and the simulated result is less than 2%, showing that the deposition film shape simulation method of the embodiment is accurate.

Since the sticking coefficient changes continuously depending on the film thickness in actual deposition process, it is thought that a development of a model and a simulation taking account of this change will leads to further improvement of the calculation accuracy.

Thus, the invention enables to simulate the deposition film shape with high accuracy. Accordingly, in manufacturing various electronic devices used in semiconductor devices, electronic components, and display devices, when a thin-film deposition is executed for filling holes, trenches, or steps, the deposition conditions for producing an excellent shape can be determined by using the deposition film shape simulation method according to the embodiment, and the actual deposition process can be executed based on the determined conditions.

Especially, when the intended thickness of the thin-film to be deposited is equal to or less than 10 nm, the process is affected more strongly at the early stage, thereby the advantage that the thickness can be calculated accurately by the deposition film shape simulation method of the embodiment is significant.

The deposition conditions determined by the deposition film shape simulation method according to the embodiment includes, for examples, temperature, pressure, gas species, film thickness, surface atom species, gas flow rate, shape of nozzle for supplying gas, location of a nozzle for supplying gas, shape of a growth chamber, distance between wafers within the chamber. According to the embodiment, one of these parameters can be optimized previously. This leads to a higher production yield in the film forming process. In addition, the need to conduct preliminary experiments or deposition processes to obtain the conditions is eliminated, thereby it becomes to manufacture electric devices with high efficiency, short lead time and high production yield.

Embodiments of the invention have been explained with the reference to the drawings. However, the invention is not limited to those embodiments. The invention may be applicable to whole of filling processes for fine trenches and holes in electronic device manufacturing.

Further, although the embodiments have been explained with silicon as a material, the invention may be applied to processes using other materials including metals, such as tungsten and molybdenum, or insulating materials.

The invention claimed is:

1. A deposition film shape simulation method for calculating a thickness of a thin-film formed by supplying deposition species on a substrate surface, comprising:
    establishing a film-forming model corresponding to the substrate surface and deposition species;
    determining parameters for points of the substrate surface;
    calculating a growth rate at each of the points of the substrate surface using the parameters;
    progressing a simulation time and finding a thickness at a target point of the substrate surface;
    measuring thickness at each of the points of the substrate surface if the thickness at the target point is smaller than a target thickness;
    re-determining the parameter for each of the points of the substrate surface by using the thickness at each of the points;
    determining a deposition condition as a function of the parameter for each of the points; and
    depositing a thin-film under the deposition condition.

2. The deposition film shape simulation method according to claim 1, wherein the parameter is changed depending on whether the thickness of the thin-film deposited on the substrate surface is smaller than a first value or is greater than the first value.

3. The deposition film shape simulation method according to claim 1, wherein the parameter includes at least one of a sticking coefficient of the deposition species and a growth rate of the thin-film.

4. The deposition film shape simulation method according to claim 1, wherein the substrate surface contains an element which is different from an element constituting the thin-film.

5. The deposition film shape simulation method according to claim 1, wherein the substrate has a hole or a step.

6. The deposition film shape simulation method according to claim 1, wherein a distribution of a supply rate of the deposition species on the substrate surface is reflected.

7. The deposition film shape simulation method according to claim 1, wherein the parameter includes a supply rate of the deposition species.

8. The deposition film shape simulation method according to claim 1, wherein a supply rate of the deposition species is changed depending on the substrate surface.

9. The deposition film shape simulation method according to claim 1, wherein the progressing the simulation time comprises progressing simulation of film forming.

10. The deposition film shape simulation method according to claim 1, wherein the measuring thickness comprises determining the thickness of the film in the simulation.

11. A method of simulating deposition film shape, comprising:
    providing a film-forming model corresponding to a substrate surface and deposition species;
    determining parameters for different points of the substrate surface;
    calculating a growth rate at each of the points of the substrate surface using the parameters;
    simulating deposition of film on the substrate surface over a simulation time;
    progressing the simulation of the deposition of film to a subsequent time and then determining whether a thickness of the film at a target point of the substrate surface is smaller than a target thickness;
    when the thickness at the target point is smaller than the target thickness, determining the thickness of the film formed in the simulation at each of the points of the substrate surface and re-determining the parameters for each of the points of the substrate surface; and
    depositing a thin-film based upon the simulation.

12. The method of claim 11, wherein the parameter is changed depending on whether the thickness of the thin-film deposited on the substrate surface is smaller than a first value or is greater than the first value.

13. The method of claim 11, wherein the parameter comprises at least one of a sticking coefficient of the deposition species and a growth rate of the film.

14. The method of claim 11, wherein the substrate surface comprises an element which is different from an element of the film.

15. The method of claim 11, wherein the substrate surface has a hole, a step, or combinations thereof.

16. The method of claim 11, wherein the parameters are determined and re-determined corresponding to a distribution of a supply rate of the deposition species on the substrate surface.

17. The method of claim 11, wherein the parameter comprises a supply rate of the deposition species.

18. The method of claim 11, wherein the supply rate of the deposition species is determined corresponding to the substrate surface.

* * * * *